(12) United States Patent
Lee et al.

(10) Patent No.: US 7,341,960 B2
(45) Date of Patent: Mar. 11, 2008

(54) METHOD FOR MAKING A METAL OXIDE SEMICONDUCTOR DEVICE

(75) Inventors: Ming-Kwei Lee, Kaohsiung (TW);
Jung-Jie Huang, Kaohsiung (TW);
Chih-Feng Yen, Kaohsiung (TW);
Tsung-Shiun Wu, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 169 days.

(21) Appl. No.: 11/270,929

(22) Filed: Nov. 10, 2005

(65) Prior Publication Data

US 2007/0105399 A1 May 10, 2007

(51) Int. Cl.
*H01L 21/31* (2006.01)
*H01L 21/469* (2006.01)

(52) U.S. Cl. .................. 438/778; 257/E21.314
(58) Field of Classification Search ................ 438/778; 257/E21.314
See application file for complete search history.

(56) References Cited

U.S. PATENT DOCUMENTS

| | | | | |
|---|---|---|---|---|
| 4,197,141 A | | 4/1980 | Bozler et al. | |
| 4,534,099 A | * | 8/1985 | Howe | 438/98 |
| 5,597,515 A | * | 1/1997 | Kauffman et al. | 252/519.12 |
| 6,380,097 B1 | | 4/2002 | Dauplaise et al. | |
| 6,580,118 B2 | * | 6/2003 | Ludwig et al. | 257/315 |
| 7,002,224 B2 | | 2/2006 | Li | |
| 2003/0066487 A1 | * | 4/2003 | Suzuki | 118/723 MW |
| 2003/0157248 A1 | * | 8/2003 | Watkins et al. | 427/256 |
| 2004/0155353 A1 | | 8/2004 | Koike et al. | |
| 2005/0224897 A1 | | 10/2005 | Chen et al. | |

* cited by examiner

*Primary Examiner*—B. William Baumeister
*Assistant Examiner*—Igwe U. Anya
(74) *Attorney, Agent, or Firm*—Christie, Parker & Hale, LLP (57) ABSTRACT

A method for making a MOS device includes: forming a titanium dioxide film on a semiconductor substrate; and subjecting the titanium dioxide film to a fluorine-containing ambient, and conducting passivation of grain boundary defects of the titanium dioxide film through reaction of fluorine and titanium dangling bonds in the titanium dioxide film.

8 Claims, 10 Drawing Sheets

---

FORMING A TITANIUM DIOXIDE FILM
ON A SEMICONDUCTOR SUBSTRATE

↓

CONDUCTING PASSIVATION OF GRAIN
BOUNDARY DEFECTS OF THE TITANIUM
DIOXIDE FILM THROUGH LPD TECHNIQUES

↓

FORMING ELECTRODES ON THE TITANIUM DIOXIDE
FILM AND THE SEMICONDUCTOR SUBSTRATE

METHOD FOR MAKING A METAL OXIDE SEMICONDUCTOR DEVICE

BACKGROUND OF THE INVENTION

1. Field of the Invention

This invention relates to a metal oxide semiconductor (MOS) device and a method for making the same, more particularly to a MOS device with a fluorine-containing titanium oxide film and a method for making the same.

2. Description of the Related Art

A metal oxide semiconductor (MOS) device, such as MOS capacitors and transistors, includes an insulator film sandwiched between an electrode layer and a semiconductor substrate. Conventionally, the insulator film is made from silicon dioxide. With rapid integration of elements and scale down of the MOS devices, the silicon dioxide film is required to be thinned to a considerable extent and the area thereof is required to be smaller and smaller. However, when the thickness of the silicon dioxide film is below 2.5 nm, the likelihood of current leakage is relatively high due to direct tunneling effect. In addition, it is also an issue on how to maintain the desired capacitance when the area of the silicon dioxide film is further reduced. In order to overcome the aforesaid drawback and to achieve this purpose, a high dielectric constant material, such as titanium dioxide, has been proposed heretofore to replace silicon dioxide. Conventionally, a polycrystalline titanium dioxide film is formed using metal organic chemical vapor deposition (MOCVD) techniques. However, the performance of a MOSFET device with the titanium dioxide film is relatively poor due to the presence of a large number of defects, such as grain boundary defects, interface traps, oxide traps, and oxygen vacancies, in the polycrystalline titanium dioxide film, and a relatively low energy barrier height for the titanium dioxide, which can result in severe current leakage.

SUMMARY OF THE INVENTION

Therefore, the object of the present invention is to provide a method for making a metal-oxide-semiconductor (MOS) device that is capable of overcoming the aforesaid drawbacks of the prior art.

According the present invention, there is provided a method for making a metal-oxide-semiconductor (MOS) device. The method comprises: forming a titanium dioxide film on a semiconductor substrate; and subjecting the titanium dioxide film to a fluorine-containing ambient, and conducting passivation of grain boundary defects of the titanium dioxide film through reaction of fluorine and titanium dangling bonds in the titanium dioxide film.

BRIEF DESCRIPTION OF THE DRAWINGS

In drawings which illustrate embodiments of the invention.

DETAILED DESCRIPTION OF THE PREFERRED EMBODIMENTS

Figure 1:
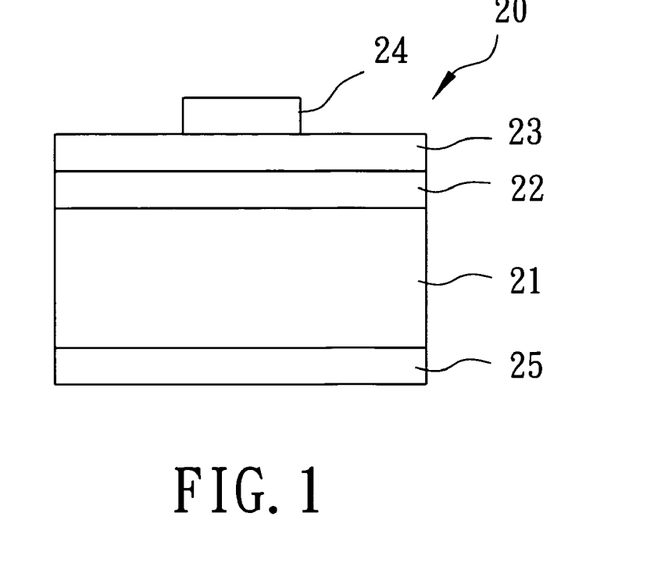
FIG. 1 is a schematic view of the first preferred embodiment of a metal-oxide-semiconductor (MOS) device according to this invention.

FIG. 1 illustrates the first preferred embodiment of a metal-oxide-semiconductor (MOS) device 20 according to the present invention. The MOS device 20 includes: a silicon semiconductor substrate 21; an insulator layer including a fluorine-containing titanium dioxide film 22 formed on the silicon semiconductor substrate 21, and a silicon dioxide film 23 formed on the titanium dioxide film 22; and upper and lower electrodes 24, 25 formed respectively on the silicon dioxide film 23 of the insulator layer and one side of the silicon semiconductor substrate 21 that is opposite to the titanium dioxide film 22, i.e., formed on opposite sides of the insulator layer.

Figure 2:
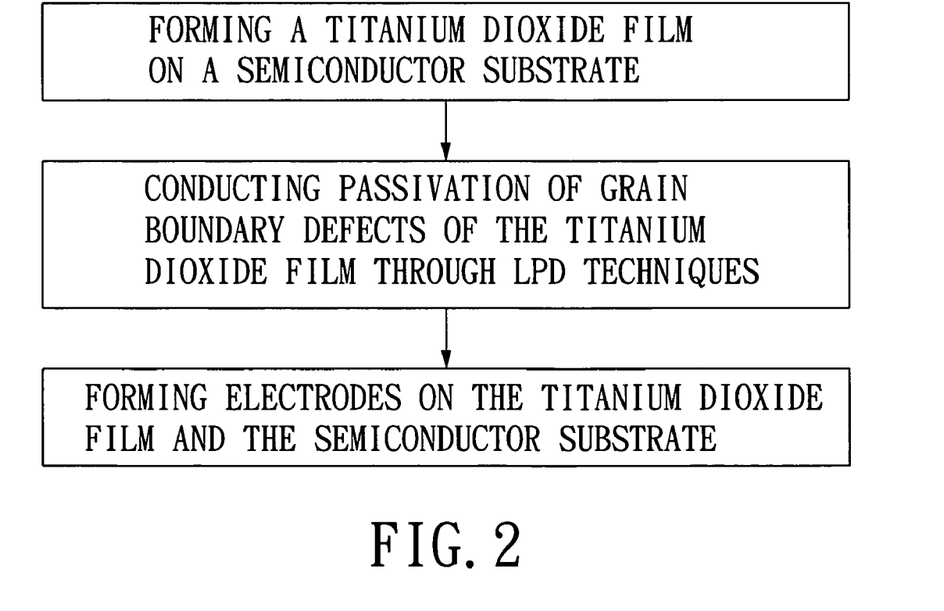
FIG. 2 is a flow chart illustrating consecutive steps of the preferred embodiment of a method for making the MOS device according to this invention.

FIG. 2 illustrates consecutive steps of the preferred embodiment of a method for making the MOS device 20 according to this invention. The method includes the steps of: forming the titanium dioxide film 22 on the semiconductor substrate 21 through metal organic chemical vapor deposition (MOCVD) techniques using tetraisopropoxytitanium (Ti(i-OC$_3$H$_7$)$_4$) and nitrous oxide (N$_2$O) as the reactant and conducting at a temperature ranging from 400-650° C. and a vacuum pressure of 5-20 Torr; subjecting the titanium dioxide film 22 to a fluorine-containing ambient, and conducting passivation of grain boundary defects of the titanium dioxide film 22 through reaction of fluorine and titanium dangling bonds in the titanium dioxide film 22; and forming the upper electrode 24 on the silicon dioxide film 23 of the insulator layer, and the lower electrode 25 on said one side of the semiconductor substrate 21.

In this embodiment, the passivation of the grain boundary defects of the titanium dioxide film 22 is conducted through liquid phase deposition (LPD) techniques that involve formation of the silicon dioxide film 23 on the titanium dioxide film 22 using a mixture of a hydrofluorosilicic acid (H$_2$SiF$_6$) solution saturated with silica gel and a boric acid solution. During the liquid phase deposition of the silicon dioxide film 23 on the titanium dioxide film 22, fluorine ions are released, and diffuse along the grain boundaries of the titanium dioxide to passivate the grain boundary defects.

Preferably, the titanium dioxide film 22 is subjected to heat treatment (i.e., annealing) in the presence of oxygen prior to subjecting the titanium dioxide film 22 to the fluorine-containing ambient at a temperature sufficient to permit reduction of oxygen vacancies in the titanium dioxide film 22. Preferably, the heat treatment temperature ranges from 700-800° C.

Preferably, the upper and lower electrodes 24, 25 are made from aluminum.

Figure 3:
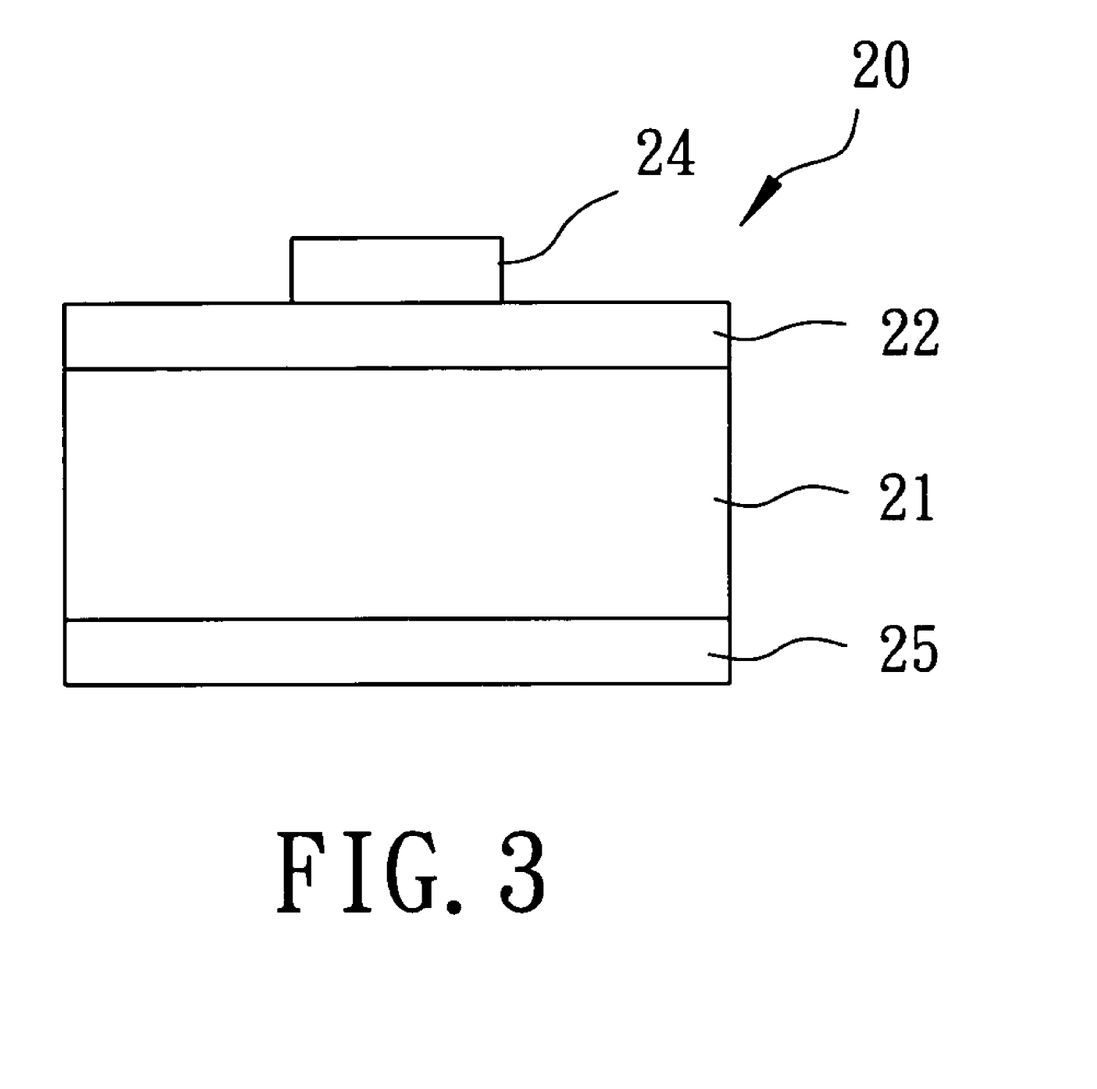
FIG. 3 is a schematic view of the second preferred embodiment of the metal-oxide-semiconductor (MOS) device according to this invention.

FIG. 3 illustrates the second preferred embodiment of the MOS device according to this invention. The MOS device of this embodiment differs from the previous embodiment in that the silicon dioxide film 23 is removed from the titanium dioxide film 22 prior to the formation of the upper and lower electrodes 24, 25.

In this embodiment, removal of the silicon dioxide film 23 is carried out by wet etching techniques using a diluted hydrofluoric acid solution.

Figure 4:
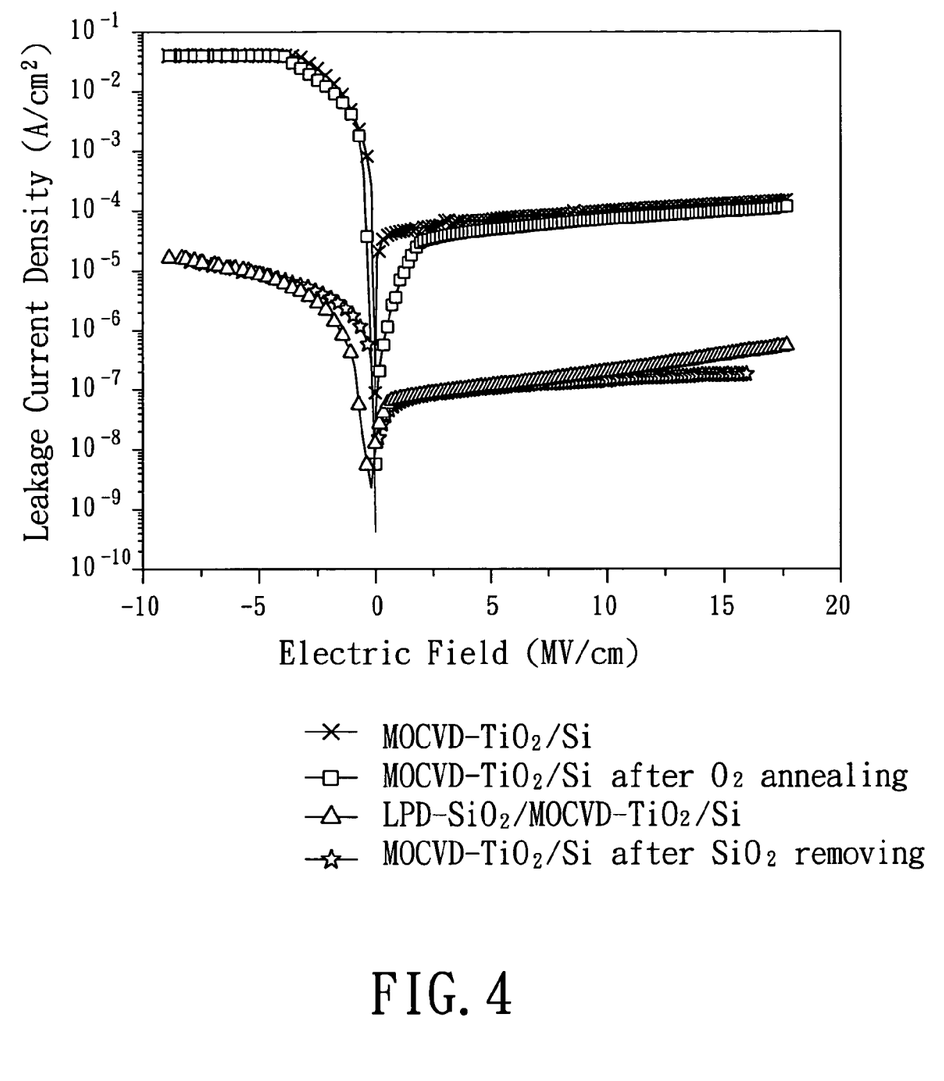
FIG. 4 shows plots of the relation between leakage current density and electric field strength for the first and second preferred embodiments and other conventional MOS devices.

FIG. 4 shows plots of the relation between leakage current density and electric field strength for the first and second preferred embodiments (the layered structure of the embodiments can be represented as LPD-$SiO_2$/MOCVD-$TiO_2$/Si and MOCVD-$TiO_2$/Si after removal of LPD-$SiO_2$ film) and other conventional MOS devices including MOCVD-$TiO_2$/Si and MOCVD-$TiO_2$/Si after $O_2$ annealing. The results show that the conventional MOS devices have much higher current leakage densities than those of the MOS devices of this invention, which indicates that the leakage current density of MOS devices can be significantly reduced by the passivation of the grain boundary defects in the titanium dioxide film 22.

Figure 5:
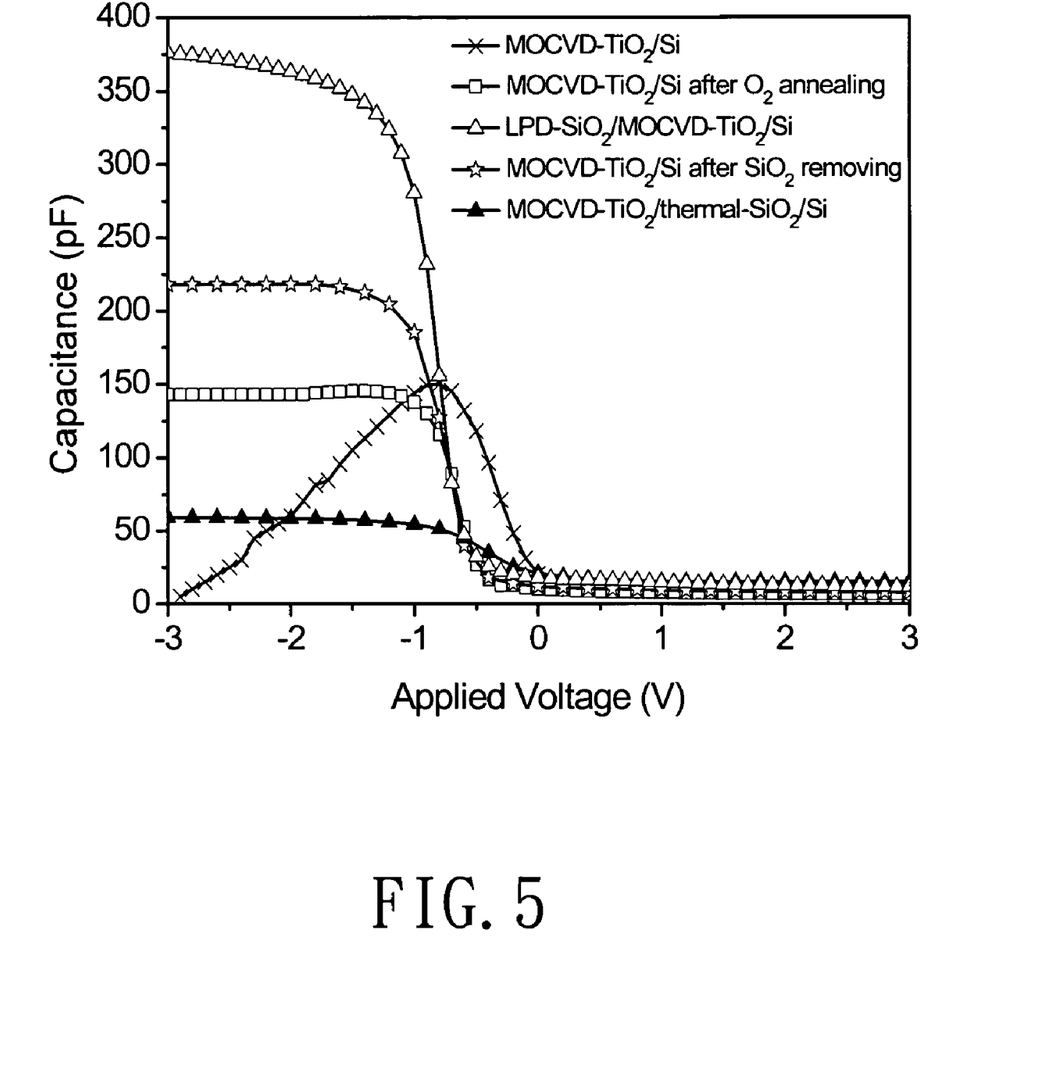
FIG. 5 shows plots of the relation between capacitance and applied voltage for the first and second preferred embodiments and other conventional MOS devices.

FIG. 5 shows plots of the relation between capacitance and applied voltage for the first and second preferred embodiments and other conventional MOS devices including MOCVD-$TiO_2$/Si, MOCVD-$TiO_2$/Si after $O_2$ annealing, and MOCVD-$TiO_2$/thermal-$SiO_2$/Si. The results show that the MOS devices 20 of this invention have higher capacitances than those of the conventional MOS devices when subjected to a negative-biased voltage.

Figure 6:
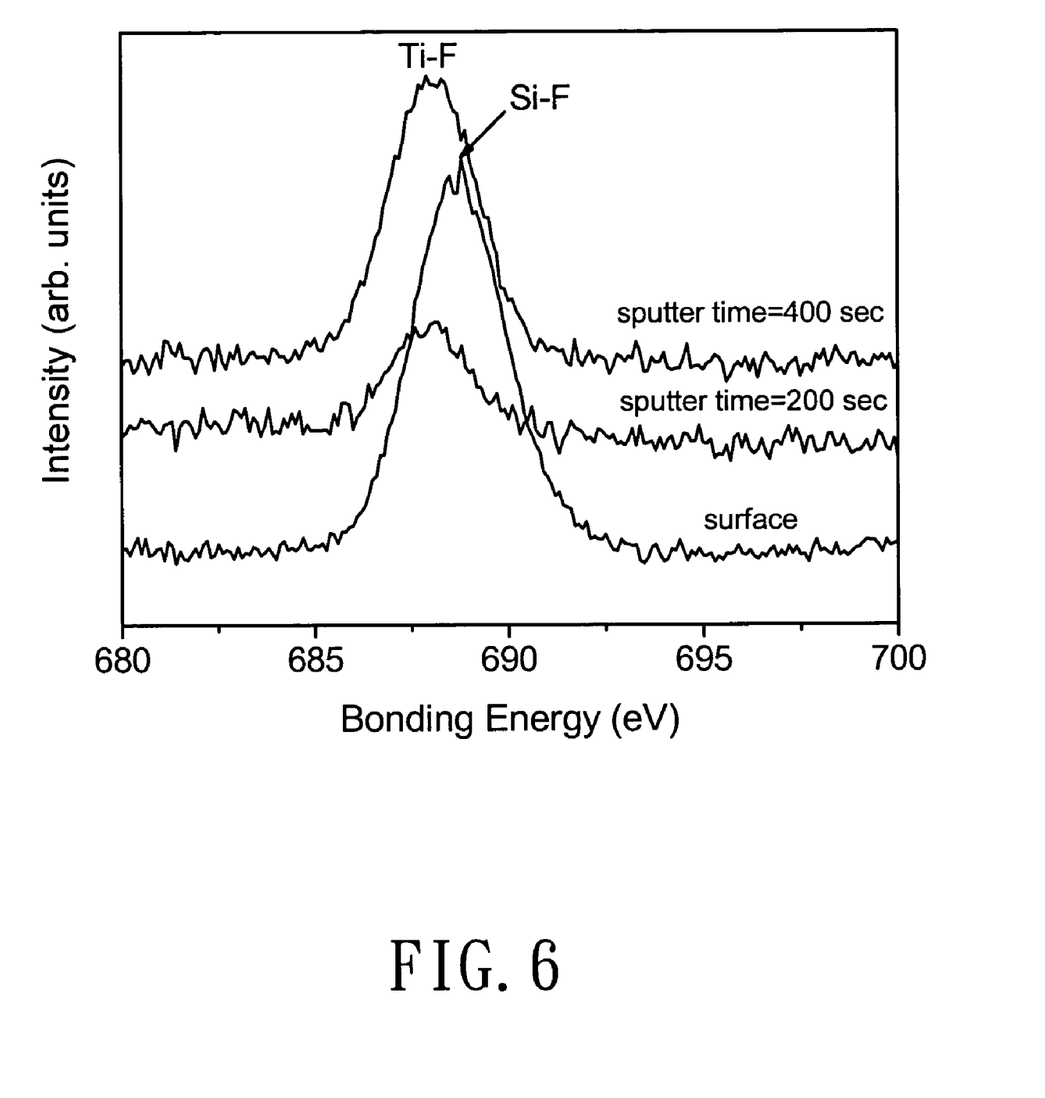
FIG. 6 shows Electron spectroscopy Chemical Analysis (ESCA) graphs for the first preferred embodiment.

FIG. 6 shows Electron spectroscopy Chemical Analysis (ESCA) graphs for the first preferred embodiment. The results show that Si—F bonding is detected on the surface of the silicon dioxide film 23, and that Ti—F bonding is detected in the titanium dioxide film 22 when the sputter time is lengthened, which indicates that the passivation of the grain boundary defects of the titanium dioxide 22 has been achieved.

Figure 7:
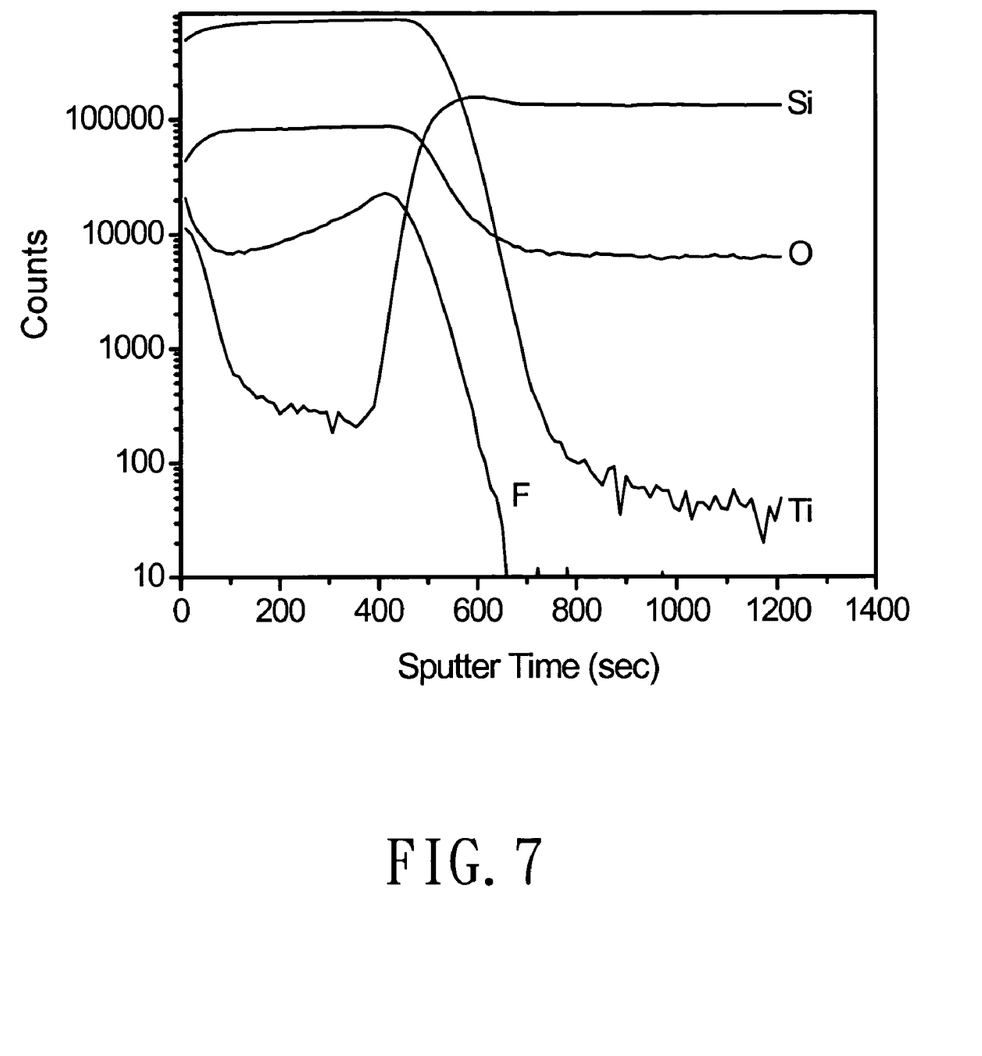
FIG. 7 shows Secondary Ion Mass Spectroscopy (SIMS) graphs for the first preferred embodiment.

FIG. 7 shows Secondary Ion Mass Spectroscopy (SIMS) graphs for the first preferred embodiment. The results indicate that fluorine diffuses into the titanium dioxide film 22 along the grain boundary of the titanium dioxide film 22 during the liquid phase deposition of the silicon dioxide film 23.

Figure 8:
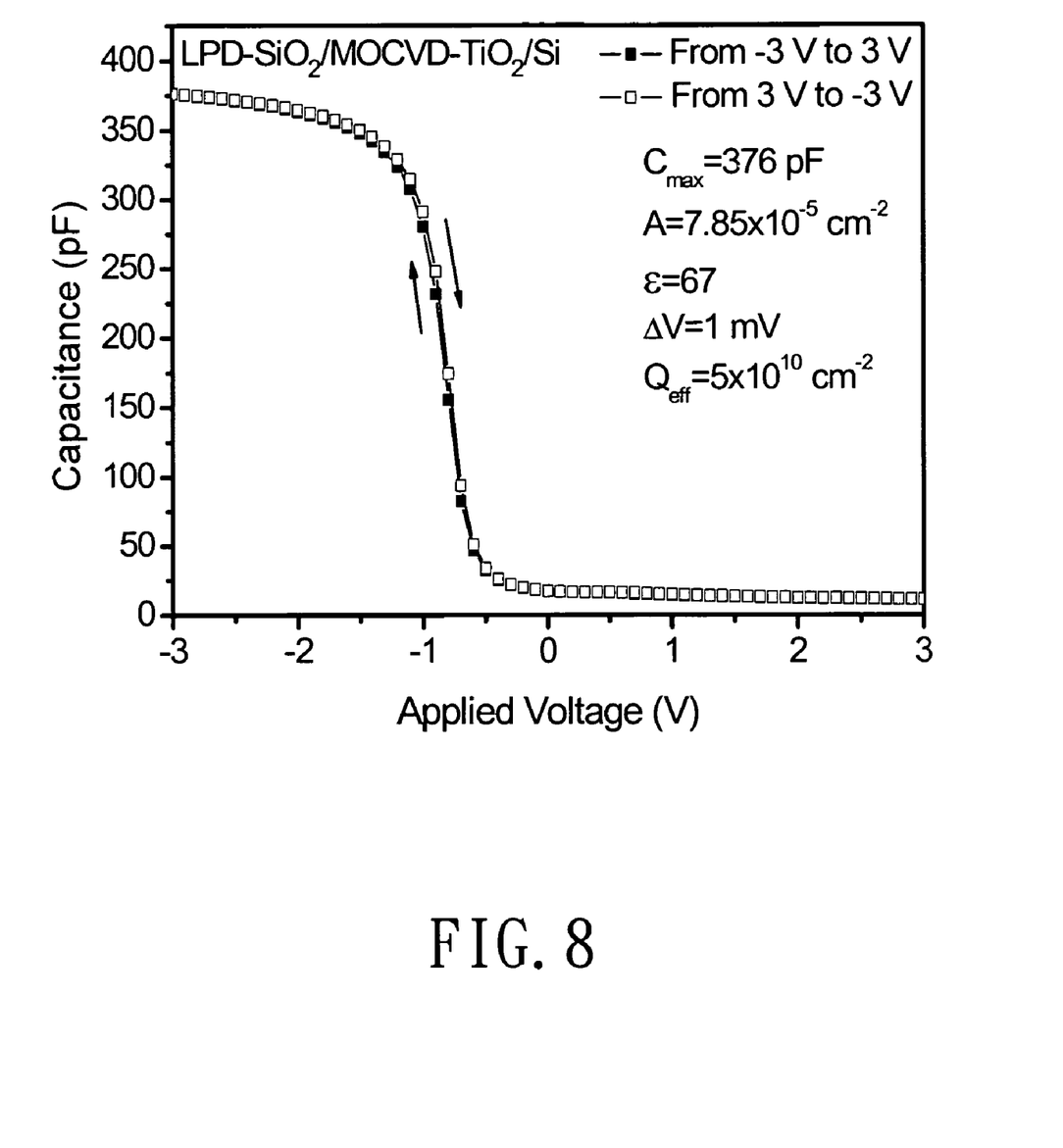
FIG. 8 shows the hysteresis loop of the C-V (capacitance and applied voltage) characteristics of the first preferred embodiment.

FIG. 8 shows a clockwise hysteresis loop of the C-V (capacitance and applied voltage) characteristics of the first preferred embodiment. The clockwise hysteresis loop of the C-V characteristics indicates that only few grain boundary defects still remain in the titanium dioxide film 22 due to the passivation of the grain boundary defects by fluorine.

Figure 9:
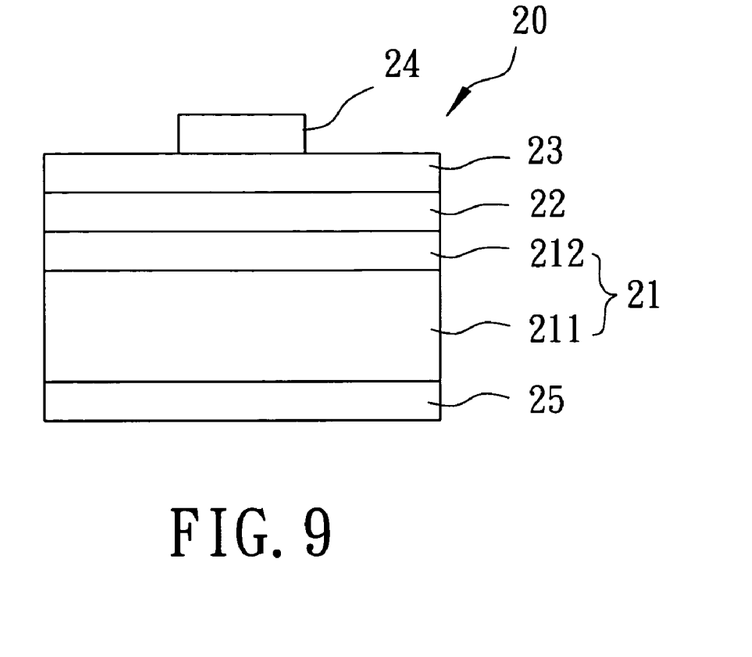
FIG. 9 is a schematic view of the third preferred embodiment of the metal-oxide-semiconductor (MOS) device according to this invention.

FIG. 9 illustrates the third preferred embodiment of a metal-oxide-semiconductor (MOS) device 20 according to the present invention. The MOS device of this invention differs from the first preferred embodiment in that the semiconductor substrate 21 includes a layer 211 of indium phosphide (InP) and an indium sulfide (InS) film 212 which is sandwiched between the titanium dioxide film 22 and the InP layer 211, and that the lower electrode 25 is made from indium-zinc alloy.

The method of making the third preferred embodiment of this invention is similar to the method of the first preferred embodiment, except that the indium sulfide film 212 is formed by treating the InP layer 211 with an ammonium sulfide (($NH_4)_2S$) solution prior to the formation of the titanium dioxide film 22 so as to form the indium sulfide film 212 on the surface of the InP layer 211, thereby preventing formation of an undesired native oxide film on the InP layer 211.

Figure 10:
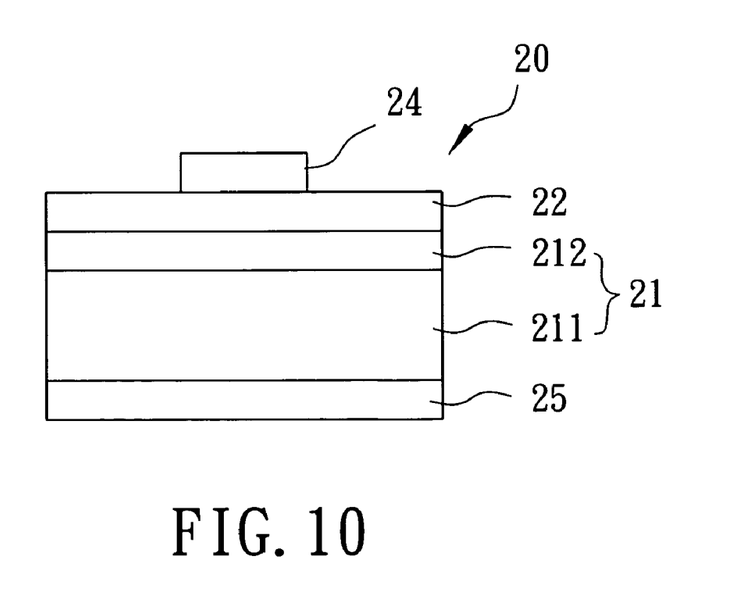
FIG. 10 is a schematic view of the fourth preferred embodiment of the MOS device according to this invention.

FIG. 10 illustrates the fourth preferred embodiment of the MOS device according to this invention. The MOS device of this embodiment differs from the third embodiment in that the silicon dioxide film 23 is removed from the titanium dioxide film 22 prior to the formation of the upper and lower electrodes 24, 25. Removal of the silicon dioxide film 23 is carried out by wet etching techniques using a diluted hydrofluoric acid solution.

Figure 11:
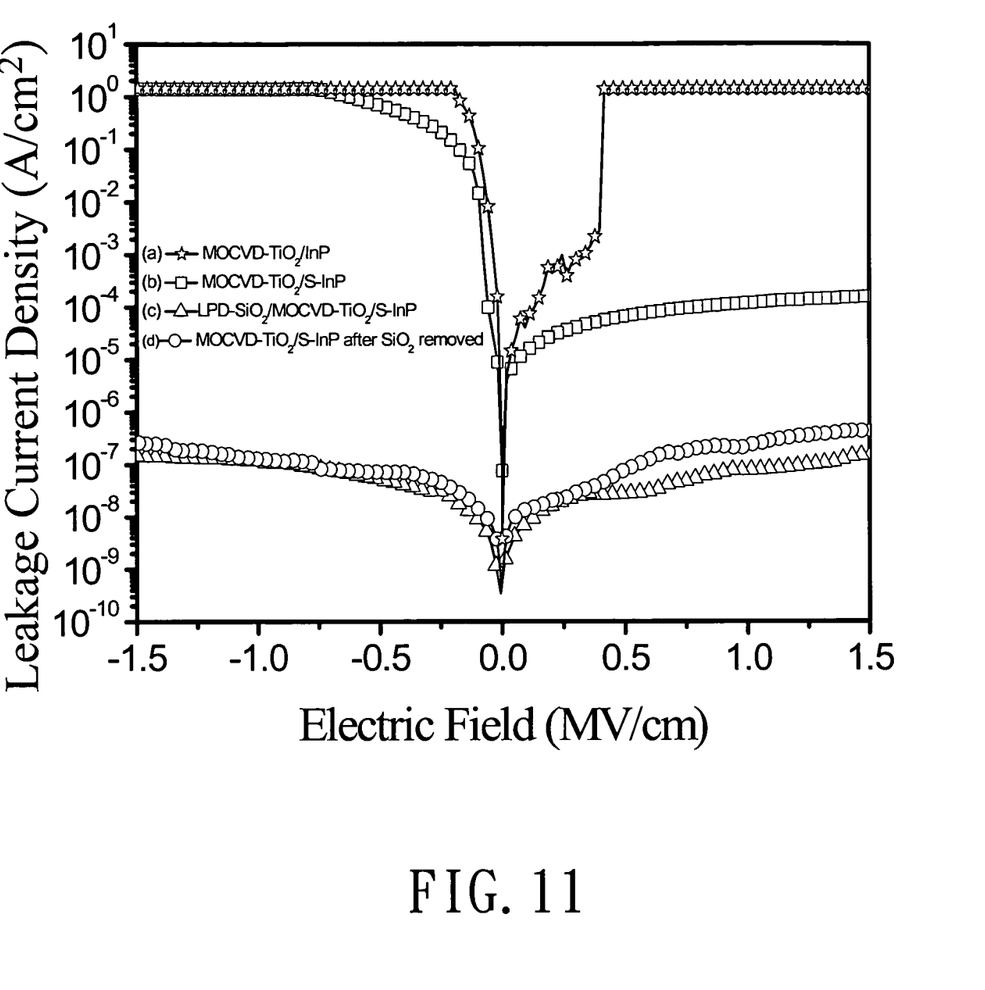
FIG. 11 shows plots of the relation between leakage current density and electric field strength for the third and fourth preferred embodiments and other conventional MOS devices.

FIG. 11 shows plots of the relation between leakage current density and electric field strength for the third and fourth preferred embodiments (the layered structure of the embodiments can be represented as LPD-$SiO_2$/MOCVD-$TiO_2$/S—InP and MOCVD-$TiO_2$/S—InP after removal of LPD-$SiO_2$ film) and other conventional MOS devices including MOCVD-$TiO_2$/InP and MOCVD-$TiO_2$/S—InP. The term "S—InP" represents the InS—InP layered structure. The results show that the conventional MOS devices have much higher leakage current densities than those of the MOS devices of this invention, which indicates that the leakage current density of MOS devices can be significantly reduced by the passivation of the grain boundary defects in the titanium dioxide film 22.

Figure 12:
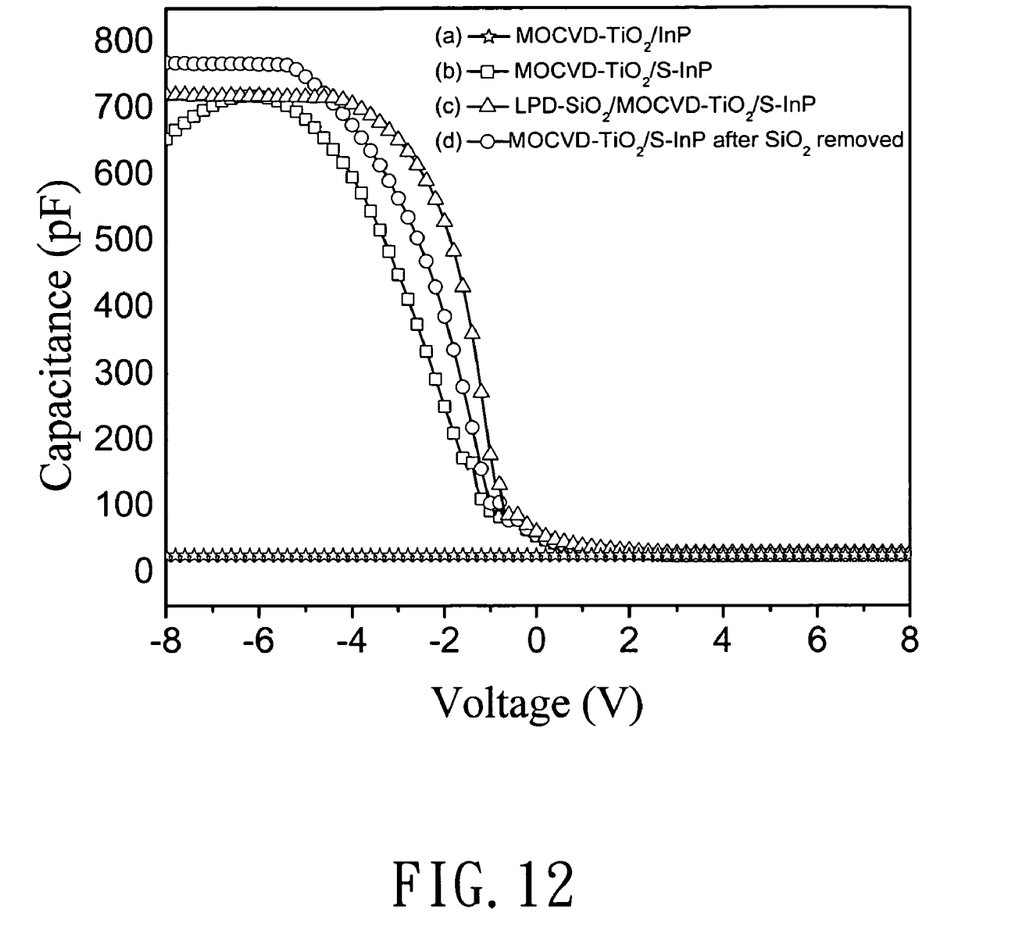
FIG. 12 shows plots of the relation between capacitance and applied voltage for the third and fourth preferred embodiments and other conventional MOS devices.

FIG. 12 shows plots of the relation between capacitance and applied voltage for the third and fourth preferred embodiments and the aforesaid conventional MOS devices. The results show that the MOS devices 20 of this invention have higher capacitances than those of the conventional MOS devices when subjected to a negative-biased voltage. Moreover, the fourth preferred embodiment has a higher capacitance than that of the third embodiment at a higher negative biased voltage, which indicates that the dielectric constant of the titanium dioxide film 22 of the fourth preferred embodiment is higher than the overall dielectric constant of the third preferred embodiment at a higher applied voltage.

EXAMPLE

This invention will now be described in greater detail with reference to the following Examples.

Example 1

A Si wafer was placed in a quartz reactor tube which was heated to 550° C. Ti(i-$OC_3H_7)_4$ was vaporized and was carried by nitrogen gas into the reactor tube. Nitrous oxide ($N_2O$) was also introduced into the reactor tube so as to react with the vapor to form a $TiO_2$ film on the Si wafer. The thickness of the $TiO_2$ film thus formed was 11.3 nm. The $TiO_2$ film was then subjected to oxygen annealing in an oxygen ambient at 750° C. for 20 minutes. A silicon dioxide film with a thickness of 1 nm was formed on the $TiO_2$ film through low temperature LPD techniques by immersing the Si wafer together with the $TiO_2$ film in a mixture of a 3.8M hydrofluorosilicic acid ($H_2SiF_6$) solution saturated with silica gel and a 0.1 M boric acid solution. The mixture was maintained at 40° C. during formation of the silicon dioxide film. The Si wafer was subsequently placed in a vapor deposition chamber for formation of Aluminum films on the silicon dioxide film and a bottom surface of the Si wafer.

Example 2

An InP substrate was immersed in an ammonium sulfide $((NH_4)_2S_x)$ solution so as to form an InS film on a surface of the InP substrate. The operating conditions for formation of the InS film were controlled to be at a temperature of 250° C. for 10 minutes. The InP substrate was then placed in a quartz reactor tube which was heated to 400° C. under a vacuum pressure of 5 torr. Ti $(i-OC_3H_7)_4$ was vaporized and was carried by nitrogen gas into the reactor tube. Nitrous oxide $(N_2O)$ was also introduced into the reactor tube so as to react with the vapor to form a $TiO_2$ film on the InS film. The thickness of the $TiO_2$ film thus formed was 53 nm. A silicon dioxide film with a thickness of 1 nm was then formed on the $TiO_2$ film through low temperature LPD techniques by immersing the InP substrate together with the $TiO_2$ film in a mixture of a 3.8M hydrofluorosilicic acid $(H_2SiF_6)$ solution saturated with silica gel and a 0.1 M boric acid solution. The mixture was maintained at 40° C. during formation of the silicon dioxide film. The InP substrate was subsequently placed in a vapor deposition chamber for formation of an Aluminum film on the silicon dioxide film and a Zn—In alloy film on a bottom surface of the InP substrate.

By fluorine passivation of the grain boundary defects in the titanium dioxide film formed by MOCVD techniques, the MOS device 20 of this invention has a superior capacitor performance than the conventional MOS devices. Moreover, passivation of the grain boundary defects of the titanium dioxide film can be achieved by the low temperature liquid phase deposition techniques, which is relatively simple and cost effective.

With the invention thus explained, it is apparent that various modifications and variations can be made without departing from the spirit of the present invention.

What is claimed is:

1. A method for making a metal-oxide-semiconductor (MOS) device comprising;
    forming a titanium dioxide film on a semiconductor substrate; and
    subjecting the titanium dioxide film to a fluorine-containing ambient, and conducting passivation of grain boundary defects of the titanium dioxide film through reaction of fluorine and titanium dangling bonds in the titanium dioxide film;
    wherein formation of the titanium dioxide film is conducted through metal organic chemical vapor deposition (MOCVD) techniques using tetraisopropoxytitanium $(Ti(i-OC_3H_7)_4)$ and nitrous oxide $(N_2O)$ as the reactant; and
    wherein the passivation of the grain boundary defects of the titanium dioxide film is conducted through liquid phase deposition (LPD) techniques that involve formation of a silicon dioxide film on the titanium dioxide film using a mixture of a hydrofluorosilicic acid $(H_2SiF_6)$ solution saturated with silica gel and a boric acid solution.

2. The method of claim 1, further comprising removing the silicon dioxide film from the titanium dioxide film.

3. The method of claim 2, wherein the removal of the silicon dioxide film is conducted through etching techniques using a diluted hydrofluoric acid solution.

4. The method of claim 3, further comprising forming an upper electrode on the titanium dioxide film, and a lower electrode on one side of the semiconductor substrate that is opposite to the titanium dioxide film.

5. The method of claim 1, wherein the semiconductor substrate is made from silicon.

6. The method of claim 1, wherein the semiconductor substrate is made from indium phosphide.

7. A method for making a metal-oxide-semiconductor (MOS) device comprising:
    forming a titanium dioxide film on a semiconductor substrate;
    subjecting the titanium dioxide film to heat treatment in the presence of oxygen at a temperature sufficient to permit reduction of oxygen vacancies in the titanium dioxide film; and
    subjecting the titanium dioxide film to a fluorine-containing ambient, and conducting passivation of grain boundary defects of the titanium dioxide film through reaction of fluorine and titanium dangling bonds in the titanium dioxide film;
    wherein formation of the titanium dioxide film is conducted through metal organic chemical vapor deposition (MOCVD) tecniques using tetraisopropoxytitanium $(Ti(i-OC_3H_7)_4)$ and nitrous oxide $(N_2O)$ as the reactant.

8. A method for making a metal-oxide-semiconductor (MOS) device comprising:
    treating a surface of a semiconductor substrate of indium phosphide with an ammonium sulfide $((NH_4)_2S_x)$ solution so as to form an indium sulfide film on the surface of the semiconductor substrate;
    forming a titanium dioxide film on the semiconductor substrate; and
    subjecting the titanium dioxide film to a fluorine-containing ambient, and conducting passivation of grain boundary defects of the titanium dioxide film through reaction of fluorine and titanium dangling bonds in the titanium dioxide film.

* * * * *